United States Patent
Tanaka

[19]

[11] Patent Number: 5,909,148
[45] Date of Patent: Jun. 1, 1999

[54] CARRIER PHASE SYNCHRONIZING CIRCUIT

[75] Inventor: Hiroki Tanaka, Tokyo, Japan

[73] Assignee: NEC Corporation, Tokyo, Japan

[21] Appl. No.: 08/845,483

[22] Filed: Apr. 25, 1997

[30] Foreign Application Priority Data

Apr. 26, 1996 [JP] Japan ................................ 8-106857

[51] Int. Cl.⁶ ....................................................... H03L 7/00
[52] U.S. Cl. .............................. 331/2; 331/23; 331/17; 375/376; 455/260; 455/265; 455/192.2; 329/306; 329/307
[58] Field of Search .................................... 331/2, 1 A, 17, 331/11, 23; 375/376; 455/260, 192.2, 265; 327/156, 161; 329/306, 307

[56] References Cited

U.S. PATENT DOCUMENTS 4,691,176  9/1987  Hsiung et al. ............................... 331/2
5,241,700  8/1993  Geesen et al. ............................ 455/260

FOREIGN PATENT DOCUMENTS 2-195714  8/1990  Japan .
3-136521  6/1991  Japan .
4-100356  4/1992  Japan .
5-41717   2/1993  Japan .
5-252027  9/1993  Japan .

Primary Examiner—Arnold Kinkead
Attorney, Agent, or Firm—Young & Thompson

[57] ABSTRACT

A carrier phase synchronizing circuit is disclosed, that comprises an AFC loop and a PLL, the AFC loop including an AFC complex multiplexing device, an LPF, a PLL complex multiplying device, a phase detector, a loop filter, an AFC filter, and a NCO, the PLL including a PLL multiplying device, a phase detector, a PLL filter, and a NCO. A loop range, a frequency control width, and a control time interval of each of the AFC filter and the PLL filter are controlled corresponding to a time change amount of the frequency error that is detected in the PLL.

19 Claims, 3 Drawing Sheets

CARRIER PHASE SYNCHRONIZING CIRCUIT

BACKGROUND OF THE INVENTION

1. Field of the Invention

The present invention relates to a carrier phase synchronizing circuit, in particular to, a carrier phase synchronizing circuit for use with a demodulator for receiving a modulated wave that is used for a communication system such as a non-stationary satellite of which a carrier frequency largely fluctuates.

2. Description of the Related Art

In a satellite communication system of which a burst signal of for example a voice signal should be transmitted on real time basis, the phase of the burst signal that is sent from an earth station, a satellite, or a terminal unit should be synchronized at high speed. However, the carrier frequency has an offset due to a Doppler shift, a drift of the local oscillator of the earth station or the satellite. The offset of the carrier frequency adversely affects the establishment of the synchronization of the carrier frequency. Conventionally, the synchronization of the carrier frequency against the offset is established by the following method.

FIG. 3 is a block diagram showing an example of a carrier phase synchronizing circuit using a conventional primary phase synchronizing loop (or phase lock loop PLL). The phase of a quasi-coherently detected output signal and the phase of an output signal of a voltage controlling oscillator (VCO) 20 that oscillates in accordance with a control voltage are compared by a phase comparator 17. An output signal of the phase comparator 17 is supplied to a phase detector 18. The phase detector 18 outputs phase error information. The phase error information is smoothed (filtered) by a low pass filter of a loop filter 19 and a output of the loop filter 19 supplied as the control voltage to the voltage controlling oscillator 20.

In the case that a receive signal contains an angular frequency offset $\Delta\omega$ (=$2\pi\Delta f$) of a carrier frequency, if the phase detector 18 with sine wave characteristics is used, a non-linear differential equation of first order that represents the response of a phase error $\theta_e(t)$ following expression is given by the following formula.

$$d\theta_e(t)/dT = \Delta\omega - K \sin \theta_e(t) \quad (1)$$

where K is a loop gain. To allow the phase of the carrier frequency to be synchronized and the carrier frequency to be stable, the following relation should be satisfied.

$$d\theta_e(t)/dT = 0.$$

With the formula (1), the following relation should be satisfied.

$$|\Delta\omega/K| = |2\pi\Delta f/K| \leq 1 \quad (2)$$

The formula (2) represents that when the frequency offset $\Delta f$ exceeds $K/2\pi$, the phase is not locked. When the loop gain K becomes large, the range of the carrier frequency that can be captured becomes wide. However, when the loop gain K becomes large, the phase jitter of the reproduced carrier can be decreased while the condition of a low C/N is satisfied. Thus, the range of the carrier frequency that can be initially captured with the primary PLL has a limit. The carrier phase synchronizing circuit using the primary PLL can be simply structured. In addition, the circuit does not need adjustments. Therefore, the demodulating unit can be accomplished at low cost. However, when the initial frequency error is out of the frequency capturing range of the PLL, the synchronized phase of the carrier frequency cannot be captured and synchronized.

FIG. 4 is a block diagram showing an example of a carrier phase synchronizing circuit that allows a frequency to be captured with a large frequency error as disclosed in Japanese Patent Laid-Open Publication No. 5-41717. In FIG. 4, a frequency error detecting circuit 27 detects a frequency error. When the frequency error is larger than a predetermined value, the carrier frequency signal is captured with an AFC loop composed of a frequency error detecting circuit 27, an automatic frequency controlling (AFC) loop filter 28, a sample hold circuit 29, a numeric controlling oscillator 30, a multiplying device 21, a low-pass filter 22, a multiplying device 23, and a phase detector 24. On the other hand, when the frequency error becomes smaller than a predetermined value, the sample hold circuit 29 holds an output control signal of the AFC 28 with a control signal of the frequency error detecting circuit 27. Then a PLL composed of a loop filter 25, a numeric controlling oscillator 26, the multiplying device 23, and the phase detector 24 performs the PLL operation instead of the AFC loop operation. Thus, even if the frequency error becomes large, the carrier frequency can be captured at high speed and stability.

In the conventional carrier phase synchronizing circuit using the PLL, the AFC loop or the PLL is selected depending on the magnitude of the frequency error. Thus, even if the frequency error is large, the carrier frequency can be captured at high speed. In addition, the phase of the carrier frequency can be stably synchronized. However, in the case that the carrier frequency of a receive signal fluctuates time by time as with a non-stationary satellite in particular a low orbit satellite communication, since the frequency error detected by the PLL fluctuates time by time, it is not effective to switch the loops depending on the magnitude of the frequency error. Thus, it is difficult to capture the carrier frequency at high speed and to stably synchronize the phase of the carrier frequency.

SUMMARY OF THE INVENTION

An object of the present invention is to provide a carrier phase synchronizing method and a circuit for allowing a demodulating unit to stably operate at high speed in a communication system of which the frequency fluctuates time by time as with a received signal of a non-stationary satellite communication in particular low orbit satellite communication.

To solve the above-described problem, the carrier phase synchronizing method according to the present invention has the following means:

A PLL is composed of a voltage controlling oscillator that oscillates with a control voltage signal, a means that compares the phase of an input signal and the phase of an output signal of the voltage controlling oscillator so as to obtain phase error information, and a means that smooths and filters the phase error information so as to generate the control voltage signal of the voltage controlling oscillator. With the PLL, a time change amount of the frequency error signal is calculated. With the time change amount detected by the PLL control, a loop range, a frequency control width, and a control time interval of each of AFC and PLL filters are controlled.

The means that generates the control signals of the loop range, the frequency control width, and the control time interval of each of AFC loop and PLL controlled by the frequency error signal which is detected by the PLL is composed of a delaying device that delays a signal for a predetermined unit time period, a subtracting device that subtracts the unit time delayed signal from the original signal, a filter that averages the change amount of the frequency error in the predetermined unit time period, and a data determining unit that determines the change amount of the averaged frequency error in the predetermined unit time period.

These and other objects, features and advantages of the present invention will become more apparent in light of the following detailed description of a best mode embodiment thereof, as illustrated in the accompanying drawings.

DESCRIPTION OF PREFERRED EMBODIMENT

Figure 1:
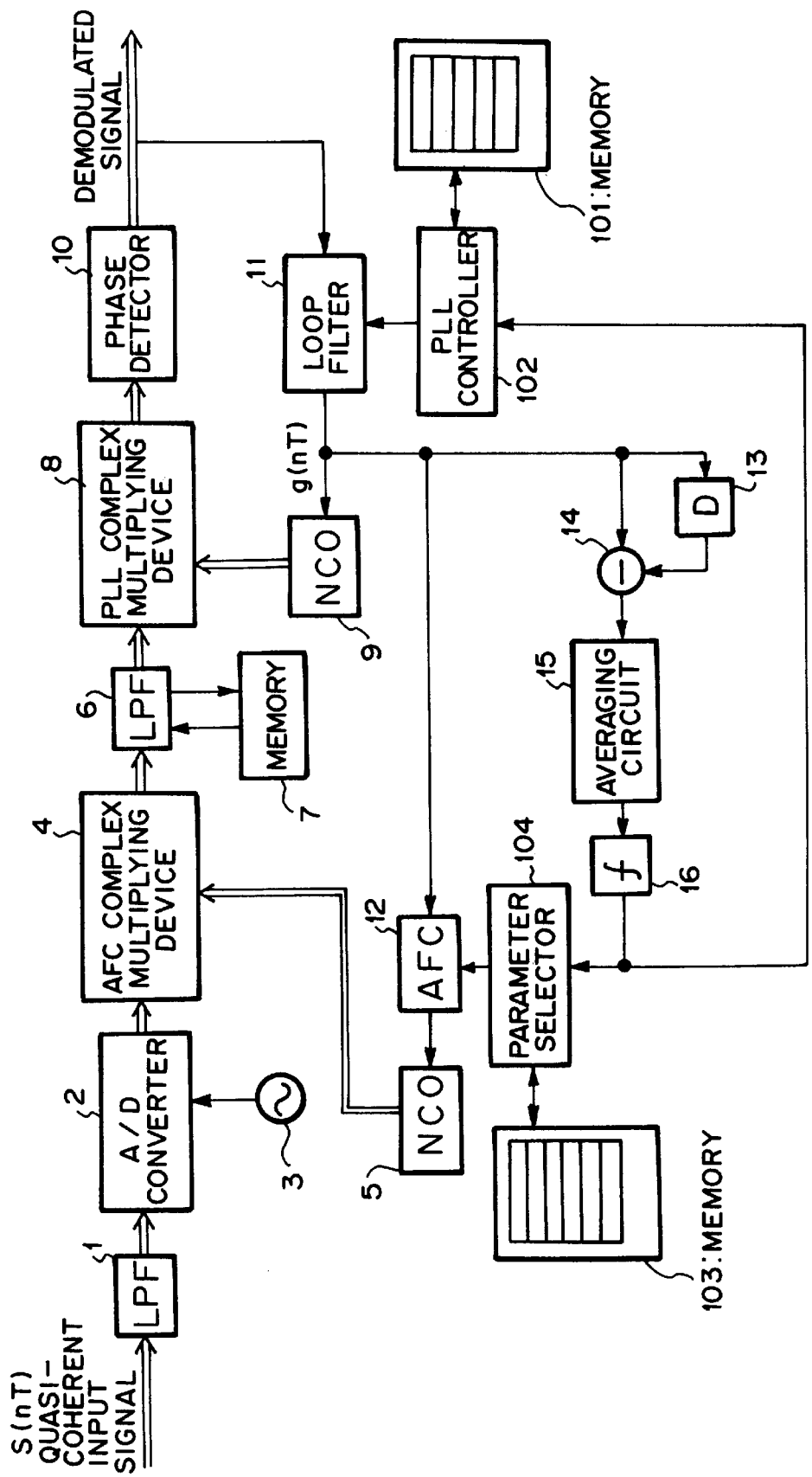
FIG. 1 is a block diagram showing the structure of an embodiment of the present invention.

Next, with reference to the accompanying drawings, the present invention will be described. FIG. 1 is a block diagram showing the structure of a carrier phase synchronizing circuit according to an embodiment of the present invention. The carrier phase synchronizing circuit synchronizes the phase of a carrier at high speed and in a wide frequency range on real time basis in the case that a carrier frequency has a large offset due to Doppler shift and drift of the local oscillator of a transmitter of a earth station or a local oscillator of a transmitter of the satellite in a satellite communication that transmits a digitally modulated PSK signal.

As shown in FIG. 1, the carrier phase synchronizing circuit comprises a first low-pass filter (LPF) 1 that removes higher harmonics of an input quasi-coherent orthogonal signal, an analog/digital (A/D) converter 2 that samples the quasi-coherent orthogonal signal received from the LPF 1 and converts the sampled signal into a digital signal, a sampling clock oscillator 3 that supplies a sampling clock signal to the A/D converter 2, a first numeric controlling oscillator (NCO) 5 that controls the oscillation frequency with a control value received from the AFC 12, a first complex multiplying device 4 that complex-multiplies the frequency of the signal sampled by the A/D converter 2 by an output signal of the first NCO 5, a second LPF 6 that restricts the signal frequency-converted by the first complex multiplying device 4 into the Nyquist band, a memory 7 that stores data information necessary for the second LPF 6, a second NCO 9 whose oscillation frequency is controlled with a control value that is supplied from the PLL filter 11, a second complex multiplying device 8 that complex-multiplies the frequency of the signal band-limited by the second LPF 6 so as to convert the frequency, a phase detector 10 that phase-detects the signal frequency-converted by the second complex multiplying device 8 and outputs phase error information, a PLL filter 11 that smooths and filters the phase error information supplied from the phase detector 10, an AFC 12 that outputs a control value for controlling the oscillation frequency of the first NCO 5 with the smoothed phase error information, a memory 101 that stores parameters of a loop range, a frequency control width, and a control time interval of the PLL, a PLL controller 102 that selects each parameter stored in the memory 101 with an output signal of a determining unit 16 so as to control the loop filter 11, a delaying device 13 that delays the smoothed phase error information for a predetermined time period, a subtracting device 14 that subtracts the smoothed phase error information delayed by the delaying device for the predetermined time period from the smoothed phase error information, a filter 15 that averages the change amount of the phase error in the predetermined time period, the data determining unit 16 that determines the change amount of the averaged phase error in the predetermined time period by the filter 15 and generates a control signal for controlling a parameter selector 104 and a PLL controller 102, a memory 103 that stores parameters of a loop range, a frequency control width, and control time interval of the AFC loop, and a parameter selector 104 that selects the parameters stored in the memory 103 corresponding to an output signal of the data determining unit 16 so as to control the AFC 12.

The first LPF 1 removes harmonics from the quasi-coherent orthogonal input signal. Thus, a frequency component $\Delta\omega$ of an offset of a carrier frequency due to Doppler shift and drift of the local oscillator of a transmitter/receiver of a earth station or a satellite is obtained. The resultant quasi-coherent orthogonal input signal is supplied to the A/D converter 2. The A/D converter 2 converts the quasi-coherent orthogonal input signal as an analog signal into a digital signal. The digital quasi-coherent orthogonal input signal is complex-multiplied by an output signal of the NCO 5 whose oscillation frequency $\omega_1$ is controlled with a control value supplied from the AFC 12. Thus, the frequency of the digital quasi-coherent orthogonal input signal is converted. The resultant quasi-coherent orthogonal input signal s (nT) is expressed by the following formula.

$$s(nT)=\cos\{(\Delta\omega-\omega_1)nT+\Phi(nT)\}+j\cdot\sin\{(\Delta\omega-\omega_1)nT+\Phi(nT)\} \quad (3)$$

The s (nT) becomes the input signal of the PLL complex multiplying device 8. At this point, the residual angular frequency error $\Delta\omega_1$ is expressed by the following formula.

$$\Delta\omega_1(nT)=\Delta\omega(nT)-\omega_1(nT) \quad (4)$$

A differential equation of first order that represents the response of the phase error $\theta_e(nT)$ detected by the primary PLL having a phase detector 10 with sine wave characteristics is expressed by the following formula.

$$\theta_e(nT)-\theta_e(nT-T)=\Delta\omega_1(nT)-K\sin\theta_e(nT) \quad (5)$$

where K is the loop gain.

Figure 2:
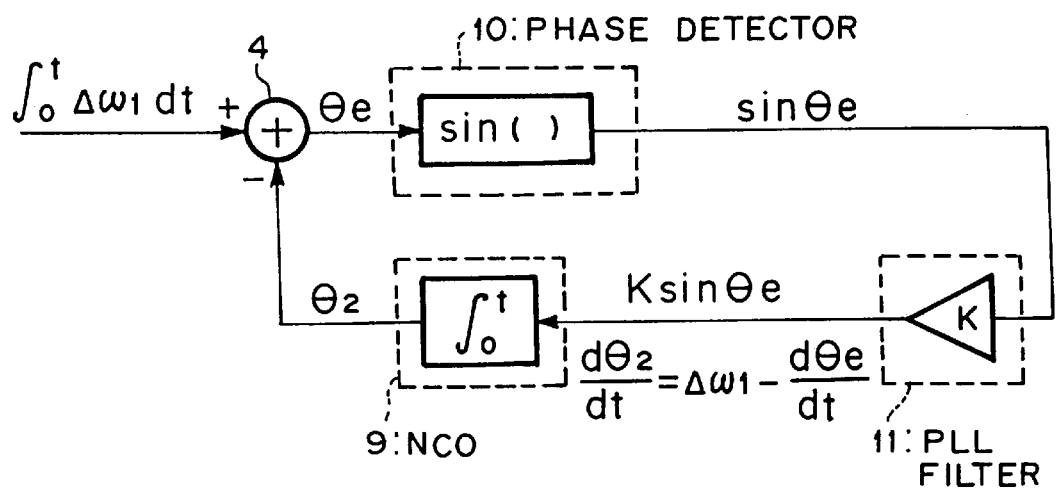
FIG. 2 is a block diagram showing a primary PLL according to the present invention.
Figure 3:
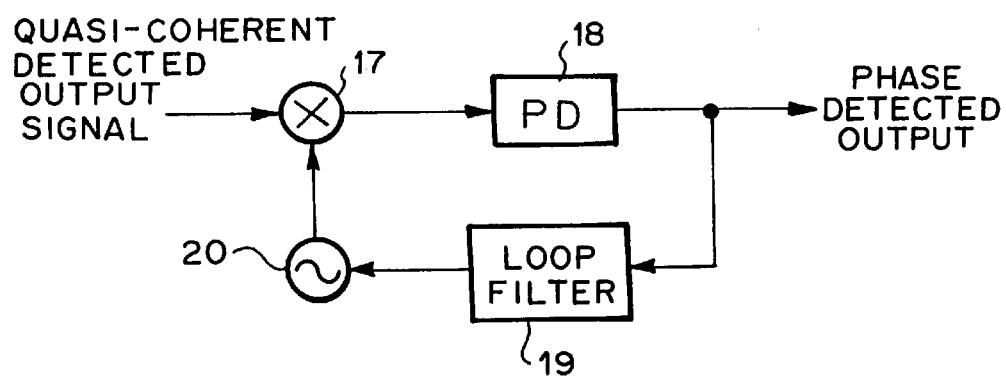
FIG. 3 is a block diagram showing a carrier phase synchronizing circuit with a conventional PLL.
Figure 4:
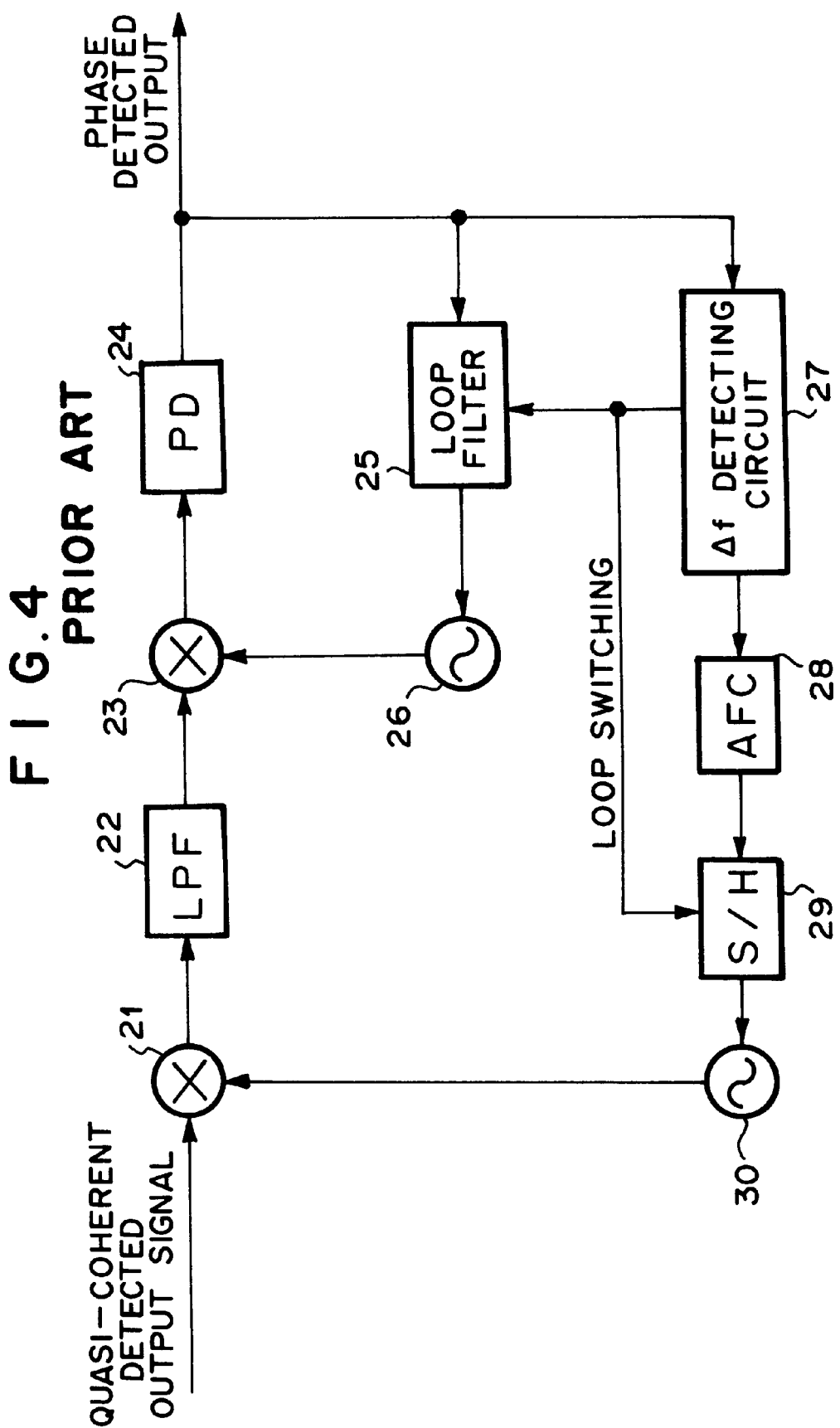
FIG. 4 is a block diagram showing a carrier phase synchronizing circuit with conventional AFC and PLL.

FIG. 2 is a block diagram showing a non-linear differential equation given by the formula (5). The input control value of the NCO 9 is proportional to the output frequency. However, since the relation between the frequency and phase is integral, the output phase is expressed in an integration form.

With the formula (5), an output signal g (nT) of the PLL filter 11 is expressed by the following formula:

$$g(nT)=K[\Delta\omega_1(nT)-\{\theta_e(nT)-\theta_e(nT-T)\}] \quad (6)$$

Since the time change amount of the phase is equivalent to the angular frequency, the output signal g (nT) is expressed by the following formula.

$$\begin{align} g(nT) &= K\{\Delta\omega_1(nT) - \omega_e(nT)\} \quad (7)\\ &= K\omega_2(nT) \end{align}$$

The output signal g (nT) of the PLL filter 11 is proportional to the oscillation frequency $\omega_2$ of the second NCO 9.

Doppler shift due to the traveling of a non-stationary satellite causes the offset frequency of the carrier of the quasi-coherent orthogonal input signal to largely fluctuate time by time. The fluctuation of the offset frequency increases the residual frequency error of the AFC loop. When residual frequency error of the AFC exceeds the frequency capturing range and the synchronization holding range of the PLL, the phase synchronization is not locked by the PLL. To stably synchronize the phase, the residual frequency error of the AFC loop should be maintained in the frequency detecting range and the synchronization holding range.

According to the present invention, to maintain the residual frequency error of the AFC loop in the frequency detecting range and the synchronous holding range of the PLL, the following control operation is performed.

When the change amount of the residual frequency error of the AFC exceeds a predetermined threshold value, the loop range, frequency control width, and control time interval of each of the AFC and PLL are widened so that the phase is synchronized. In contrast, when the change amount of the residual frequency error of the AFC becomes small, the loop range, frequency control width, and control time interval is narrowed so as to stably synchronize the phase of the carrier free of noise.

Such an operation will be described with reference to a carrier phase synchronizing circuit shown in FIG. 1.

The oscillating frequency of the second NCO 9 is controlled so that it becomes the residual frequency error of the AFC loop. The output value of the PLL filter 11 is proportional to the oscillating frequency of the second NCO 9. Thus, the time change amount of the output value of the PLL filter 11 is equivalent to the fluctuation of the error of the residual frequency of the AFC loop. Thus, the change amount of the residual frequency error of the AFC loop is expressed with a time change amount $\Delta g(nT)$ of an output value g(nT) of the PLL filter 11 by the following formula.

$$\Delta g(nT)=g(nT)-g(nT-T) \quad (8)$$

$\Delta g(nT)$ is calculated by the delaying device 13 and the subtracting unit 14. An output signal of the subtracting device 14 is supplied to the averaging circuit 15 so as to average the output signal. The output signal of the averaging circuit 15 is supplied to the data determining unit 16 so as to determine whether or not the output signal of the averaging circuit 15 is large toward a threshold level. An output signal of the data determining unit 16 is supplied to the parameter selector 104 and the PLL controller 102. The parameter selector 104 selects the parameters of the loop range, the frequency control width, and the control time interval of the AFC loop and outputs these parameters to the AFC 12. The PLL controller 102 selects the parameters of the loop range, the frequency control width, and the control time interval of the PLL corresponding to the output signal of the data determining unit 16 so as to control the PLL filter 11.

When the time constant of the low-pass filter as the loop filter 11 of the PLL is varied, the loop band and frequency control width as parameters can be controlled. When the time constant is increased, the loop range and capture range of the PLL can be widened so as to stably maintain the PLL. However, when the PLL is begun to operate, to decrease the lock up time, the time constant of the loop filter 11 is decreased. With respect to the control time interval, the time constant of the loop filter 11 is not always constant. Instead, the time constant is varied at predetermined time interval so as to maintain the stability and quick response of the characteristics of the PLL. The time constant can be set up in various manners. For example, when the setup data is selected from the memories 101 and 103 corresponding to the output signal of the data determining device 16, the operation of the PLL can be controlled with flexibility. There features applies to the AFC loop.

As described above, the present invention has effects that a carrier phase synchronizing method and a circuit for allowing a demodulating unit to stably operate at high speed and to follow a carrier frequency in a communication system of which the frequency fluctuates time by time as with a receive signal of a non-stationary satellite communication in particular low orbit satellite communication.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A carrier phase synchronizing circuit for recovering a carrier from an input signal, comprising:

an automatic frequency controlling loop and a carrier phase locked loop for suppressing a frequency error of the carrier; and controlling means for calculating a time change amount of a frequency error signal detected by said carrier phase locked loop and generating a control signal for controlling a loop range, a frequency control width, and a control time interval of each of said automatic frequency controlling loop and said carrier phase locked loop corresponding to the time change amount of the frequency error.

2. The carrier phase synchronizing circuit as set forth in claim 1, wherein the input signal is a quasi-coherent orthogonal signal; and wherein the fluctuation of the carrier frequency is shorter than the capture range of the automatic frequency control.

3. The carrier phase synchronous circuit as set forth in claim 1, wherein said controlling means widens the loop range, the frequency control width, and the control time interval of each of said automatic frequency controlling loop and said carrier phase locked loop so as to maintain the synchronization of the phase when the time change amount of the frequency error exceeds a predetermined value; and wherein said controlling means narrows the loop range, the frequency control width, and the control time interval of each of said automatic frequency controlling loop and said carrier phase locked loop so as to maintain the synchronization of the phase when the time change amount of the frequency error is smaller than the predetermined value.

4. A carrier phase synchronizing circuit for recovering a carrier from an input signal, comprising:

an automatic frequency controlling loop for suppressing a frequency error of the carrier;

a carrier phase locked loop including:

a voltage controlling oscillator for oscillating a frequency corresponding to a control voltage;

detecting means for comparing the phase of the input signal and the phase of an output signal of the voltage controlling oscillator so as to obtain phase error information; and a controlling unit for smoothing the phase error information and generating a control signal of the voltage controlling oscillator; and controlling means for calculating a time change amount of a frequency error signal detected by said carrier phase locked loop and generating a control signal for controlling a loop range, a frequency controlling width, and a control time interval of each of said automatic frequency control loop and said carrier phase locked loop corresponding to an averaged signal of the time change amount of the frequency error.

5. The carrier phase synchronizing circuit as set forth in claim 4, wherein the input signal is a quasi-coherent orthogonal signal, and wherein fluctuation of the carrier frequency is shorter than the capture range of the automatic frequency control.

6. The carrier phase synchronous circuit as set forth in claim 4, wherein said controlling means widens the loop range, the frequency control width, and the control time interval of each of said automatic frequency controlling loop and said carrier phase locked loop so as to maintain the synchronization of the phase when the time change amount of the frequency error exceeds a predetermined value, and wherein said controlling means narrows the loop range, the frequency control width, and the control time interval of each of said automatic frequency controlling loop and said carrier phase locked loop so as to maintain the synchronization of the phase when the time change amount of the frequency error is smaller than the predetermined value.

7. The carrier phase synchronizing circuit as set forth in claim 4, wherein said detecting means includes:

delaying means for delaying a signal for a predetermined time period;

a subtracting device for subtracting the signal delayed for the predetermined time period from the original signal;

a filter for averaging an output signal of said subtracting device, the output signal being a change amount of the frequency error for the predetermined time period; and a data detecting unit for determining the change amount of an averaged frequency error in the predetermined time period and generating control signals of the loop range, the frequency control width, and the control time interval of each of said automatic frequency controlling loop and said carrier phase locked loop.

8. A carrier phase synchronizing circuit, comprising:

means for converting a frequency of an input signal corresponding to an output signal of a first oscillator whose frequency is varied corresponding to a first control signal;

a first low-pass filter (LPF) for restricting the band width of the frequency converted signal into Nyquist band;

means for comparing the phase of an output signal of the first LPF and the phase of an output signal of a second oscillator that is oscillated corresponding to a second control signal so as to obtain a phase error signal;

means for generating a control signal of the second oscillator through a second LPF corresponding to the phase error signal;

means for smoothing an output signal of the second LPF and generating a first control signal of said first oscillator through a third LPF; and controlling means for calculating a time change amount of an output signal of the second LPF and controlling a loop range, a frequency control width, and a control time interval of the third LPF corresponding to the time change amount.

9. The carrier phase synchronizing circuit as set forth in claim 8, wherein the input signal is a quasi-coherent orthogonal signal, and wherein fluctuation of the carrier frequency is shorter than the capture range of the automatic frequency controlling loop.

10. The carrier phase synchronizing circuit as set forth in claim 8, wherein said controlling means widens the loop range, the frequency control width, and the control time interval of each of said automatic frequency control loop and said carrier phase locked loop so as to maintain the synchronization of the phase when time change amount of the frequency error exceeds a predetermined value, and wherein said controlling means narrows the loop range, the frequency control width, and the control time interval of each of said automatic frequency control loop and said carrier phase locked loop so as to maintain the synchronization of the phase when the time change amount of the frequency error is smaller than the predetermined value.

11. The carrier phase synchronizing circuit as set forth in claim 1, wherein a time constant of the automatic frequency controlling loop and the carrier phase locked loop are controlled by each of a setup data of memory.

12. The carrier phase synchronizing circuit as set forth in claim 4, wherein a time constant of the automatic frequency controlling loop and the controlling unit are varied by each of a setup data of memories, and the setup data of memories are selected by the output signal of the controlling means.

13. A carrier phase synchronizing circuit for recovering a carrier from an input signal, comprising:

an automatic frequency controlling loop and a carrier phase locked loop for suppressing a frequency error of the carrier; and controlling means for calculating a time change amount of a frequency error signal detected by said carrier phase locked loop and controlling a loop range, a frequency control width, and a control time interval of each of said automatic frequency controlling loop and said carrier phase locked loop corresponding to the time change amount of the frequency error, wherein the input signal is a quasi-coherent orthogonal signal, and wherein the fluctuation of the carrier frequency is shorter than the capture range of the automatic frequency controlling loop.

14. A carrier phase synchronizing circuit for recovering a carrier from an input signal, comprising:

an automatic frequency controlling loop and a carrier phase locked loop for suppressing a frequency error of the carrier; and controlling means for calculating a time change amount of a frequency error signal detected by said carrier phase locked loop and controlling a loop range, a frequency control width, and a control time interval of each of said automatic frequency controlling loop and said carrier phase locked loop corresponding to the time change amount of the frequency error, wherein said controlling means widens the loop range, the frequency control width, and the control time interval of each of said automatic frequency controlling loop and said carrier phase locked loop so as to maintain the synchronization of the phase when the time change amount of the frequency error exceeds a predetermined value, and wherein said controlling means narrows the loop range, the frequency control width, and the control time interval of each of said automatic frequency control loop and said carrier phase locked loop so as to maintain the synchronization of the phase when the time change amount of the frequency error is smaller than the predetermined value.

15. A carrier phase synchronizing circuit for recovering a carrier from an input signal, comprising:

an automatic frequency controlling loop for suppressing a frequency error of the carrier;

a carrier phase locked loop including:

a voltage controlling oscillator for oscillating a frequency corresponding to a control voltage;

detecting means for comparing the phase of the input signal and the phase of an output signal of the voltage controlling oscillator so as to obtain phase error information, and a controlling unit for smoothing the phase error information and generating a control signal of the voltage controlling oscillator; and controlling means for calculating a time change amount of a frequency error signal detected by said carrier phase locked loop and controlling a loop range, a frequency controlling width, and a control time interval of each of said automatic frequency controlling loop and said carrier phase locked loop corresponding to an averaged signal of the time change amount of the frequency error, wherein the input signal is a quasi-coherent orthogonal signal, and wherein the fluctuation of the carrier frequency is shorter than the capture range of the automatic frequency control.

16. A carrier phase synchronizing circuit for recovering a carrier from an input signal, comprising:

an automatic frequency controlling loop for suppressing a frequency error of the carrier;

a carrier phase locked loop including:

a voltage controlling oscillator for oscillating a frequency corresponding to a control voltage;

detecting means for comparing the phase of the input signal and the phase of an output signal of the voltage controlling oscillator so as to obtain phase error information, and a controlling unit for smoothing the phase error information and generating a control signal of the voltage controlling oscillator; and controlling means for calculating a time change amount of a frequency error signal detected by said carrier phase locked loop and controlling a loop range, a frequency controlling width, and a control time interval of each of said automatic frequency controlling loop and said carrier phase locked loop corresponding to an averaged signal of the time change amount of the frequency error, wherein said controlling means widens the loop range, the frequency control width, and the control time interval of each of said automatic frequency controlling loop and said carrier phase locked loop so as to maintain the synchronization of the phase when the time change amount of the frequency error exceeds a predetermined value, and wherein said controlling means narrows the loop range, the frequency control width, and the control time interval of each of said automatic frequency controlling loop and said carrier phase locked loop so as to maintain the synchronization of the phase when the time change amount of the frequency error is smaller than the predetermined value.

17. A carrier phase synchronizing circuit for recovering a carrier from an input signal, comprising:

an automatic frequency controlling loop for suppressing a frequency error of the carrier;

a carrier phase locked loop including:

a voltage controlling oscillator for oscillating a frequency corresponding to a control voltage;

detecting means for comparing the phase of the input signal and the phase of an output signal of the voltage controlling oscillator so as to obtain phase error information, and a controlling unit for smoothing the phase error information and generating a control signal of the voltage controlling oscillator; and controlling means for calculating a time change amount of a frequency error signal detected by said carrier phase locked loop and controlling a loop range, a frequency controlling width, and a control time interval of each of said automatic frequency controlling loop and said carrier phase locked loop corresponding to an averaged signal of the time change amount of the frequency error, wherein said detecting means includes:

delaying means for delaying a signal for a predetermined time period;

a subtracting device for subtracting the signal delayed for the predetermined time period from the signal;

a filter for averaging an output signal of said subtracting device, the output signal being a change amount of the frequency error for the predetermined time period; and a data detecting unit for determining the change amount of the averaged frequency error in the predetermined time period and generating control signals of the loop range, the frequency control width, and the control time interval of each of said automatic frequency controlling loop and said carrier phase locked loop.

18. The carrier phase synchronizing circuit as set forth in claim 13, wherein a time constant of the automatic frequency controlling loop and the carrier phase locked loop are controlled by each of a setup data of memory.

19. The carrier phase synchronous circuit as set forth in claim 15, wherein a time constant of the automatic frequency controlling loop and the controlling unit are varied by each of a setup data of memories, and the setup data of memories are selected by the output signal of the controlling means.

* * * * *